(12) United States Patent
Baummer et al.

(10) Patent No.: US 9,845,703 B2
(45) Date of Patent: Dec. 19, 2017

(54) TURBINE COMPONENT SURFACE TREATMENT PROCESSES AND SYSTEMS

(71) Applicant: General Electric Company, Schenectady, NY (US)

(72) Inventors: James Carroll Baummer, Greenville, SC (US); Thomas Robert Reid, Wilmington, DE (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/568,424

(22) Filed: Dec. 12, 2014

(65) Prior Publication Data

US 2016/0169035 A1    Jun. 16, 2016

(51) Int. Cl.
| | | |
|---|---|---|
| *F01D 25/08* | (2006.01) | |
| *B05D 1/32* | (2006.01) | |
| *B05C 9/04* | (2006.01) | |
| *B05C 7/00* | (2006.01) | |
| *B05C 9/12* | (2006.01) | |
| *F01D 25/00* | (2006.01) | |
| *B05D 3/06* | (2006.01) | |
| *C23C 14/04* | (2006.01) | |
| *C23C 4/01* | (2016.01) | |

(52) U.S. Cl.
CPC ............... *F01D 25/08* (2013.01); *B05C 7/00* (2013.01); *B05C 9/04* (2013.01); *B05C 9/12* (2013.01); *B05D 1/322* (2013.01); *C23C 4/01* (2016.01); *C23C 14/042* (2013.01); *F01D 25/002* (2013.01); *B05D 3/067* (2013.01); *F05D 2230/90* (2013.01)

(58) Field of Classification Search
CPC ......... F01D 25/08; F01D 25/002; C23C 4/01; C23C 14/042; B05C 7/00; B05C 9/04; B05C 9/12; B05D 1/322; B05D 3/067; F05D 2230/90
USPC ........................................................ 427/553
See application file for complete search history.

(56) References Cited

U.S. PATENT DOCUMENTS

| | | | |
|---|---|---|---|
| 5,902,647 A | 5/1999 | Venkataramani et al. | |
| 6,335,078 B2 * | 1/2002 | Venkataramani ........ | B05D 1/32 428/131 |
| 7,083,824 B2 | 8/2006 | Stankowski et al. | |
| 7,147,899 B2 | 12/2006 | Fernihough et al. | |
| 7,192,622 B2 | 3/2007 | Fernihough et al. | |

(Continued)

FOREIGN PATENT DOCUMENTS

EP    1076106 B1    10/2003

*Primary Examiner* — Katherine A Bareford
*Assistant Examiner* — Christina McClure
(74) *Attorney, Agent, or Firm* — Ernest G. Cusick; Frank A. Landgraff

(57) ABSTRACT

A turbine component surface treatment process includes passing a UV-curable maskant through one or more fluid flow passages, wherein at least a portion of the UV-curable maskant exits the one or more fluid flow passages at an exterior surface of the turbine component, applying a UV light to the exterior surface of the turbine component, wherein the UV light cures at least a portion of the UV-curable maskant exiting the one or more fluid flow passages, and, treating the exterior surface with a treatment material, wherein the portion of the UV-curable maskant cured by the UV light substantially blocks the treatment material from entering the one or more fluid flow passages.

8 Claims, 3 Drawing Sheets

(56) References Cited

U.S. PATENT DOCUMENTS

2005/0100672 A1* 5/2005 Stankowski .............. F01D 5/00
427/282
2005/0140044 A1* 6/2005 Jackson .................... B01J 2/20
264/142

* cited by examiner

TURBINE COMPONENT SURFACE TREATMENT PROCESSES AND SYSTEMS

BACKGROUND OF THE INVENTION

The subject matter disclosed herein relates to turbine components and, more specifically, to processes and systems for treating turbine component surfaces comprising one or more fluid flow passages.

In gas turbine engines, such as aircraft engines for example, air is drawn into the front of the engine, compressed by a shaft-mounted rotary-type compressor, and mixed with fuel. The mixture is burned, and the hot exhaust gases are passed through a turbine mounted on a shaft. The flow of gas turns the turbine, which turns the shaft and drives the compressor and fan. The hot exhaust gases flow from the back of the engine, driving it and the aircraft forward.

During operation of gas turbine engines, the temperatures of combustion gases may exceed 3,000° F., considerably higher than the melting temperatures of the metal parts of the engine which are in contact with these gases. Operation of these engines at gas temperatures that are above the metal part melting temperatures can depend in part on supplying a cooling air to the outer surfaces of the metal parts through various methods. The metal parts of these engines that are particularly subject to high temperatures, and thus require particular attention with respect to cooling, are the metal parts forming combustors and parts located aft of the combustor.

The metal temperatures can be maintained below melting levels by using fluid flow passages (also known as cooling holes) incorporated into some engine components. Sometimes, one or more coatings such as thermal barrier coatings (TBCs) may also be applied to the component by a thermal spray process. However, coating processes such as the thermal spray process and other cleaning processes (e.g., grit blasting, shot peening, water jet washing) may result in overspray that partially or completely blocks the component's cooling holes.

As a result, present coating and cleaning processes can involve a multi-step process of applying a partial layer coating (e.g., TBC coating), allowing the component and the coating to sufficiently cool to a temperature at which the component can easily be handled, removing the component from an application fixture on which the thermal spraying takes place, and removing any masking, which is then followed by separately removing the well-cooled, solidified coating from the fluid flow passages using a water jet or other cleaning methods. To prevent the fluid flow passages from becoming obstructed beyond a level from which they can be satisfactorily cleaned, only a fraction of the desired coating thickness may be applied prior to cleaning. As a result, the entire process may need to be repeated several times until the desired coating thickness is reached. This process can result in low productivity, high cycle time, and increases costs by a factor of five to ten times that of applying the same coating to a similar non-holed part. Even when coatings are not applied, the pressure cleaning methods used to clean the target surfaces of articles can similarly overflow and obstruct or affect the article's fluid flow passages.

Accordingly, alternative turbine component surface treatment processes and systems would be welcomed in the art.

BRIEF DESCRIPTION OF THE INVENTION

In one embodiment, a turbine component surface treatment process is disclosed. The turbine component surface treatment process includes passing a UV-curable maskant through one or more fluid flow passages, wherein at least a portion of the UV-curable maskant exits the one or more fluid flow passages at an exterior surface of the turbine component, applying a UV light to the exterior surface of the turbine component, wherein the UV light cures at least a portion of the UV-curable maskant exiting the one or more fluid flow passages, and, treating the exterior surface with a treatment material, wherein the portion of the UV-curable maskant cured by the UV light substantially blocks the treatment material from entering the one or more fluid flow passages.

In another embodiment, a turbine component surface treatment system is disclosed. The turbine component surface treatment system includes a UV-curable maskant applier configured to pass a UV-curable maskant through one or more fluid flow passages of a turbine component, wherein at least a portion of the UV-curable maskant exits the one or more fluid flow passages at an exterior surface of the turbine component. The turbine component surface treatment system can also include a UV light source configured to apply a UV light to the exterior surface of the turbine component, wherein the UV light cures at least a portion of the UV-curable maskant exiting the one or more fluid flow passages. The turbine component surface treatment system can further include a surface treatment apparatus configured to treat the exterior surface with a treatment material, wherein the portion of the UV-curable maskant cured by the UV light substantially blocks the treatment material from entering the one or more fluid flow passages.

These and additional features provided by the embodiments discussed herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the inventions defined by the claims. The following detailed description of the illustrative embodiments can be understood when read in conjunction with the following drawings, where like structure is indicated with like reference numerals and in which:

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Figure 1:
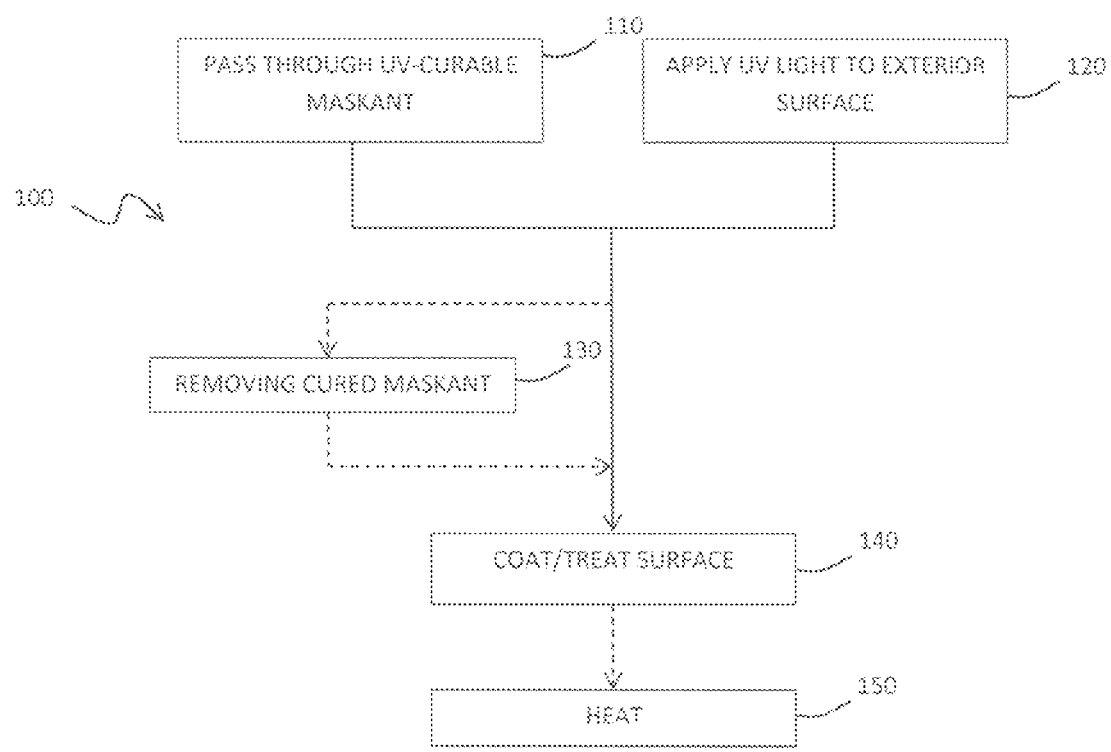
FIG. 1 illustrates a turbine component surface treatment process according to one or more embodiments shown or described herein.

Referring now to FIG. 1, a turbine component surface treatment process 100 is illustrated. With additional reference to FIGS. 2-6, the turbine component surface treatment process 100 can be used to treat (e.g., coat or clean) an exterior surface 11 of a turbine component 10, such as by using a turbine component surface treatment system 90.

The turbine component 10 can comprise any turbine component comprising one or more fluid flow passages 20 (also known as cooling holes, cooling channels, fluid passageways, or the like). Specifically, the turbine component 10 can comprise one or more fluid flow passages 20 that fluidly connect to an exterior surface 11 such that a fluid (e.g., cooling air such as compressor discharge air) can pass through the turbine component 10 via the one or more fluid flow passages, exit out the exterior surface 11 and potentially help cool one or more locations of the turbine component 10. As will become appreciated herein, the exterior surface 11 can comprise any surface of the turbine component 10 that may need to be treated such as through coating, cleaning or the like. Coating, for example, can include at least partially applying a coating material to an exterior surface 11 such as through the use of a thermal spray gun or the like. Cleaning, for example, can include stripping, washing, bathing, submerging, and/or otherwise removing material from the exterior surface 11 such as through grit blasting, shot peening, water jet washing or the like. While specific examples have been listed herein, it should be appreciated that any other treating operation using a treating material 51 contacting the exterior surface 11 can additionally or alternatively be realized. The fluid flow passage 20 may further start on any other surface 12 such as an interior surface, an opposite exterior surface, or any other surface that facilitates for a fluid connection via the one or more fluid flow passages 20 to the exterior surface 11 as illustrated.

Figure 2:
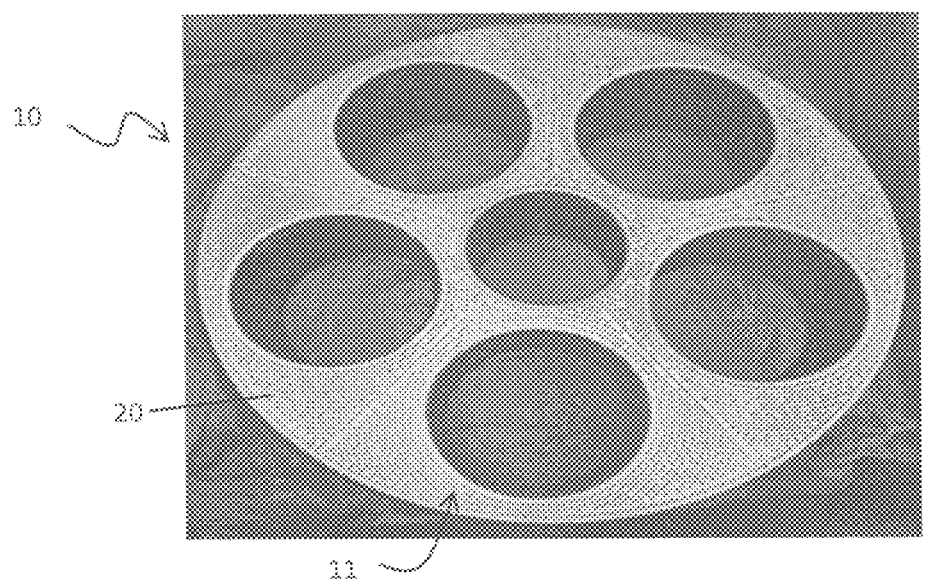
FIG. 2 is a perspective view of an exemplary turbine component comprising a plurality of fluid flow passages according to one or more embodiments shown or described herein.

The turbine component 10 can comprise a variety of different turbine components. For example, in some embodiments, the turbine component 10 may comprise a combustion cap effusion plate such as a cap effusion plate for the combustor section as illustrated in FIG. 2. Such embodiments may facilitate the passage of the UV-curable maskant through a plurality of fluid flow passages 20 in the effusion plate as should become appreciated herein. In other embodiments, the turbine component 10 may comprise a blade or bucket, shroud, nozzle, vane, transition piece, liner, combustor, or any other turbine component comprising one or more fluid flow passages 20. In some embodiments, the turbine component 10 can generally comprise a hot gas path component or a combustion component.

The turbine component surface treatment process 100 generally comprises the combined steps of passing a UV-curable maskant 31 through one or more fluid flow passages 20 in step 110 and applying a UV light 41 to the exterior surface 11 of the turbine component 10 in step 120.

The UV-curable maskant 31 applied in step 110 can comprise any material that is curable when subject to UV light while possessing an uncured viscosity sufficient for allowing it to pass through the one or more fluid passages 20 and out an exit hole 21 in the exterior surface 11. For example, in some embodiments, the UV-curable maskant 31 may comprise an acrylated urethane epoxy or any other UV-curable epoxy. In some embodiments, the UV-curable maskant 31 may comprise one or more additional constituents to facilitate the treatment process. For example, when treatment in step 140 comprises brazing (e.g., the treatment material 51 comprises braze material), the UV-curable maskant 31 may further comprise a braze stop-off material that may further help prevent subsequent braze material from flowing into the one or more fluid passages 20. Such braze stop-off material may comprise, for example, any suitable oxide such as aluminum oxide, titanium oxide, yttrium oxide, magnesium oxide or the like.

The UV-curable maskant 31 may be passed through the one or more fluid flow passages 20 in step 110 using any suitable process or device. For example, the UV-curable maskant 31 may be passed through the one or more fluid flow passages 20 using any suitable force such as pressurized gas, physical force, or any suitable alternative that can force the UV-curable maskant 31 through the one or more fluid flow passages 20. In some embodiments, such as that illustrated in FIG. 3, a UV-curable maskant applier 30 may be utilized to pass the UV-curable maskant 31 through the one or more fluid flow passages 20. The UV-curable maskant applier 30 may comprise any suitable material deposition device such as a roller, sprayer, coater, injector, or the like that not only applies the UV-curable material 31, but also passes it through the one or more fluid flow passages using a suitable force (e.g., pressurized gas or the like). For example, the UV-curable maskant applier 30 may broadly roll out UV-curable maskant 31 on the other surface 12, then apply a force (e.g., pressurized gas) to pass the deposited UV-curable maskant 31 through the one or more fluid flow passages 20 such that it starts to exit the exit hole(s) 21 on the exterior surface 11 of the turbine component 10.

Figure 4:
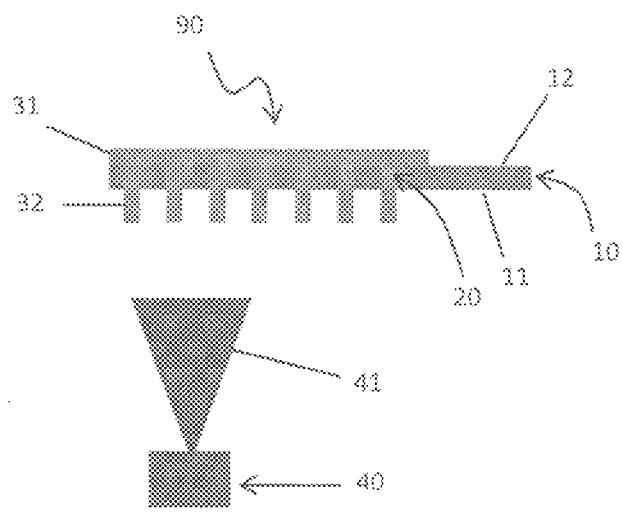
FIG. 4 is a schematic illustration of part of a turbine component surface treatment system including a UV light source applying a UV light according to one or more embodiments shown or described herein.

The UV light 41 applied in step 120 can comprise any UV light capable of curing the UV-curable maskant 31 as it exits from the one or more fluid flow passages 20 out the exterior surface 11 of the turbine component 10. For example, the UV light 41 may be applied from a UV light source 40 as illustrated in FIG. 4. The UV light source 40 may comprise any suitable bulb, lamp, wand, arc or the like, or combinations thereof, capable of producing sufficient UV light 40 to cure at least a portion of the UV-curable maskant 31. The UV light 41 may be applied from a single UV light source 40 or a plurality of UV light sources 40.

Furthermore, as illustrated in FIG. 1, UV light 41 may be applied in step 120 before, during and/or after the UV-curable maskant 31 is passed through the one or more fluid flow passages 20. For example, in some embodiments, the UV light 41 may be applied in step 120 at the same time that the UV-curable maskant 31 passes through and exits the one or more fluid flow passages 20. In such embodiments, the UV-curable maskant 31 can be cured upon exiting the exit hole 21. This, in turn, can lead to the formation of cured UV-curable maskant 31 extending (e.g., protruding) from the turbine component 10 such as in the shape of stalactites 32 as best illustrated in FIG. 4. Such stalactites may be more susceptible to scraping away from the exterior surface 11 of the turbine component 10 to facilitate subsequent treating. Such embodiments may also minimize or eliminate the spreading of UV-curable maskant 31 onto the exterior surface 11 itself to ensure the entirety of the exterior surface 11 can be treated (e.g., coated or cleaned) with only the one or more fluid flow passages 20 being masked.

In some embodiments, the application of the UV light 41 in step 120 may initiate after the UV-curable maskant 31 starts or finishes passing through the one or more fluid flow passages 20. In such embodiments, additional parameters may be employed to limit the spreading of the UV-curable maskant 31 across the exterior surface 11. For example, the exterior surface 11 may face downwards so that any excess UV-curable maskant 31 drips away from the exterior surface 11 until curing via the UV light 41. In other embodiments, the non-cured UV-curable maskant 31 may be wiped off the exterior surface before application of the UV light 41 so that UV-curable maskant 31 only resides in the one or more fluid flow passages 20 when UV light 41 is applied.

The turbine component surface treatment process 100 can optionally comprise removing at least a portion of the UV-curable maskant 31 in step 130 that was cured by the UV light 41 applied in step 120. For example, when a portion of UV-curable maskant 31 forms stalactites 32 during curing by the UV light 41, then the turbine component surface treatment process 100 may comprise removing the one or more stalactites 32 in step 130 prior to treating the exterior surface 11 of the turbine component 10 in step 140. In some embodiments, if any UV-curable maskant 31 is cured onto the exterior surface 11 of the turbine component, said portion may be removed in step 130 to expose the portion of the exterior surface 11 to be treated.

Figure 5:
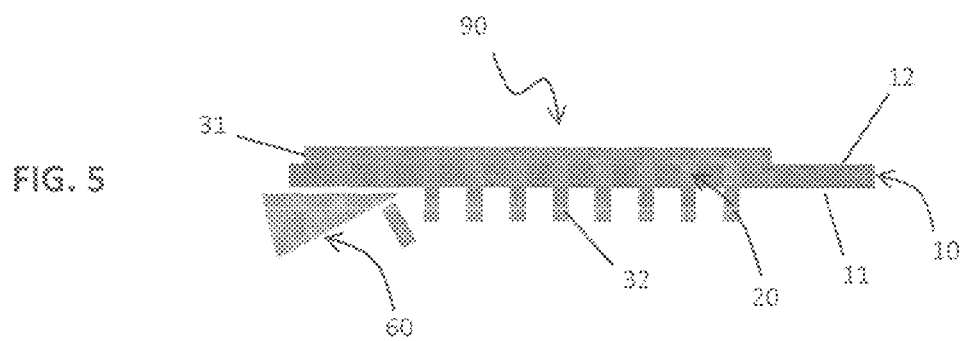
FIG. 5 is a schematic illustration of part of a turbine component surface treatment system including a scraper removing a portion of the UV-curable maskant cured by the UV light according to one or more embodiments shown or described herein; and, FIG. 6 is a schematic illustration of part of a turbine component surface treatment system including a surface treatment apparatus applying a treatment material according to one or more embodiments shown or described herein.

Removal of at least a portion of the UV-curable maskant 31 cured by the UV light 41 may occur using any scraper 60 such as that illustrated in FIG. 5. The scraper 60 can comprise any blade, edge or the like that can break at least a portion of the UV-curable maskant 31 cured by the UV light 41 away from the exterior surface 11 of the turbine component. Furthermore, by removing at least a portion of the UV-curable maskant 31 cured by the UV light 41, an exposed exterior surface 11 and the remaining cured UV-curable maskant 31 may comprise substantially continuous surface to help facilitate the subsequent treating process (e.g., coating or cleaning) in step 140.

The turbine component surface treatment process 100 further comprises treating the exterior surface 11 of the turbine component 10 with a treatment material 51 in step 140, wherein the portion of the UV-curable maskant 31 cured by the UV light 41 substantially blocks the treatment material 51 from entering the one or more fluid flow passages 20 of the turbine component 10.

Treatment in step 140 can comprise any suitable treatment technique utilizing a treatment material 51 on the exterior surface 11 of the turbine component 10 such as coating, cleaning or the like. Coating, for example, can include at least partially applying a coating material to the exterior surface 11 such as through the use of a thermal spray gun or the like. In some embodiments where the treatment material 51 comprises a coating material such as any suitable composition of a thermal barrier coating material. As used herein, thermal barrier coating material can comprise all or part of a bond coat layer of MCrAlY, wherein M is preferably Ni, Co, or a combination thereof, followed by a layer of yttria stabilized zirconia. In some embodiments, the coating material 51 may comprise a thermal spray coating, an oxidation protection coating, a metallic coating, a bond coating, an overlay coating, or any other type of coating such as those that may be used for a bond coat, thermal barrier coating, environmental barrier coating, or combinations thereof. Likewise, cleaning, for example, can include stripping, washing, bathing, submerging, and/or otherwise removing material from the exterior surface 11 using cleaning material such as grit for grit blasting, shot for shot peening, water for water jet washing, acid for acid stripping or the like.

In some embodiments, the treatment material 51 may be applied through a surface treatment apparatus 50 (i.e., an apparatus configured to deposit, project or otherwise apply the treatment material 51 onto the exterior surface 11 of the turbine component 10). For example, in embodiments where the treatment material comprises a coating material, the surface treatment apparatus 50 can comprise any suitable coating device including, but are not limited to, thermal spray, air plasma spray (APS), high velocity oxygen fuel (HVOF) thermal spray, high velocity air fuel spraying (HVAF), vacuum plasma spray (VPS), electron-beam physical vapor deposition (EBPVD), chemical vapor deposition (CVD), ion plasma deposition (IPD), combustion spraying with powder or rod, cold spray, sol gel, electrophoretic deposition, tape casting, polymer derived ceramic coating, slurry coating, dip-application, vacuum-coating application, curtain-coating application, brush-application, roll-coat application, agglomeration and sintering followed by spray drying, or combinations thereof.

Figure 6:
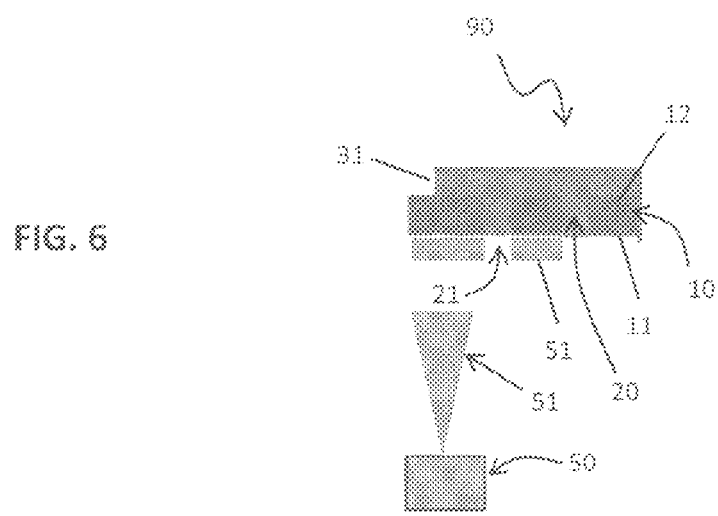

As illustrated in FIG. 6, the UV-curable maskant 31 cured by the UV light 41 disposed in, and potentially protruding from, the one or more fluid flow passages 20 can substantially block the treatment material from entering the one or more fluid flow passages 20. As such, the exterior surface 11 of the turbine component 10 can be treated (e.g., coated or cleaned) with limited or no treatment material (e.g., coating material or cleaning material) entering the one or more fluid flow passages 20. Accordingly, the overall treatment process may thereby require less post-treatment work to (re)clear the one or more fluid flow passages of treatment material 51 to reduce labor and increase process time.

The turbine component surface treatment process 100 can optionally further comprising heating the turbine component 10 in step 150 to remove the UV-curable maskant 31 after treating the exterior surface in step 140. Heating in step 150 can comprise applying any amount of heat sufficient to remove the remnant UV-curable maskant 31 remaining in the one or more fluid flow passages 20 such as by burning it away or at least melting it so it can drain away. In some embodiments, heating in step 150 may comprise the same act as curing the treatment material 51 applied to the exterior surface 11 (such as when curing a coating material). In other embodiments, heating in step 150 to remove the UV-curable maskant 31 from the one or more fluid flow passages 20 may comprise a distinct step. Heating in step 150 may also comprise heating to any suitable temperature for any suitable time in any suitable atmosphere. For example, in some embodiments, heating in step 150 may comprise heating to a temperature of at least 1,200° F. to help incinerate the UV-curable maskant 31.

In some embodiments, the turbine component surface treatment process 100 may be performed using a turbine component surface treatment system 90 as illustrated in FIGS. 3-6. The turbine component surface treatment system 90 can generally comprise one or more of the elements discussed herein with respect to carrying out the turbine component surface treatment method 100.

Figure 3:
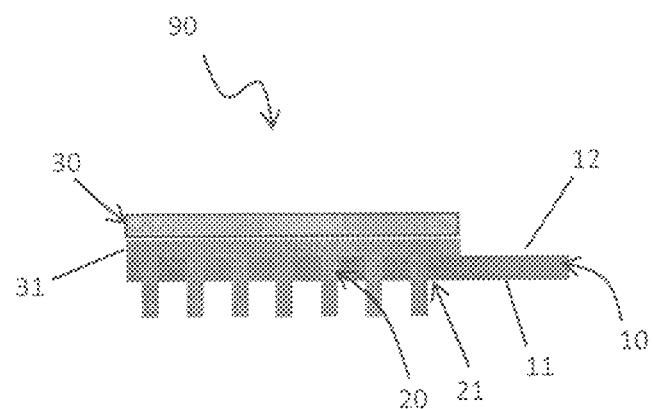
FIG. 3 is a schematic illustration of part of a turbine component surface treatment system including a UV-curable maskant applier applying a UV-curable maskant according to one or more embodiments shown or described herein.

For example, the turbine component surface treatment system 90 can generally comprise a UV-curable maskant applier 30 configured to pass the UV-curable maskant 31 through one or more fluid flow passages 20 of the turbine component illustrated in FIG. 3. As discussed above, the UV-curable maskant applier 30 can be configured such that at least a portion of the UV-curable maskant 31 exits the one or more fluid flow passages 20 (such as out an exit hole 21) at an exterior surface 11 of the turbine component 10.

The turbine component surface treatment system 90 can further comprise a UV light source 40 configured to apply a UV light 41 to the exterior surface 11 of the turbine component 10 as illustrated in FIG. 4. As discussed above, the UV light source 40 can be configured such that the UV light 41 cures at least a portion of the UV-curable maskant 31 exiting the one or more fluid flow passages 20.

Furthermore, the turbine component surface treatment system 90 can comprise a surface treatment apparatus 50 as illustrated in FIG. 6. The surface treatment apparatus 50 can be configured to treat the exterior surface 11, wherein the portion of the UV-curable maskant 31 cured by the UV light 41, such as stalactites 32, substantially blocks a treatment material 51 from entering the one or more fluid flow passages 11. For the example, the surface treatment apparatus 50 may comprise a coater (e.g., thermal spray gun or the like), cleaner (e.g., grit blaster or the like), or any other apparatus suitable for treating the exterior surface 11 of the turbine component 10 with a treatment material 51.

The turbine component surface treatment system 90 may optionally comprise any additional elements to facilitate the treatment of the exterior surface 11 of the turbine component 10. For example, in some embodiments, the turbine component surface treatment system 90 may comprise a scraper 60 as illustrated in FIG. 5. As discussed above, the scraper 60 may optionally be used prior to treating the exterior surface 11 such as to remove any or at least some of the portion of the UV-curable maskant 31 cured by the UV light 41 (such as stalactites 32) prior to the surface treatment apparatus 50 treating the exterior surface 11 of the turbine component 10. In even some embodiments, the turbine component surface treatment system 90 may comprise a heater configured to heat the turbine component 10 to remove the UV-curable maskant 31 after the surface treatment apparatus 50 treats the exterior surface 11 of the turbine component 10.

It should now be appreciated that turbine component surface treatment processes and systems may be utilized to mask fluid flow passages in turbine components by passing a UV-curable maskant through the fluid flow passages and applying a UV light to an exterior surface. As the UV-curable maskant exits the fluid flow passages out the exterior surface, the UV light can cure the at least a portion of the UV curable maskant. The protruding cured portion of the UV-curable maskant (e.g., stalactites) can thereby be removed so that the remaining exterior surface can be treated, such as through coating or cleaning, without having treatment material enter the one or more fluid flow passages.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A turbine component surface treatment process comprising:
    passing a UV-curable maskant through one or more fluid flow passages, wherein at least a portion of the UV-curable maskant exits the one or more fluid flow passages at an exterior surface of the turbine component;
    applying a UV light to the exterior surface of the turbine component concurrently when the UV-curable maskant is passed through the one or more fluid flow passages, wherein the UV light cures at least a portion of the UV-curable maskant exiting the one or more fluid flow passages; and wherein applying the UV light partially cures at least the portion of the UV-curable maskant into one or more stalactites that extend away from the exterior surface,
    treating the exterior surface with a treatment material, wherein the one or more stalactites of the UV-curable maskant cured by the UV light substantially blocks the treatment material from entering the one or more fluid flow passages, and
    further comprising heating the turbine component to remove the UV-curable maskant after treating the exterior surface.

2. The turbine component surface treatment process of claim 1, further comprising removing the one or more stalactites prior to treating the exterior surface.

3. The turbine component surface treatment process of claim 1, wherein the UV-curable maskant exits a plurality of fluid flow passages at the exterior surface of the turbine component.

4. The turbine component surface treatment process of claim 1, wherein the UV-curable maskant comprises an acrylated urethane epoxy.

5. The turbine component surface treatment process of claim 1, wherein treating the exterior surface comprises coating the exterior surface, and wherein the treatment material comprises a coating material.

6. The turbine component surface treatment process of claim 1, wherein the UV-curable maskant comprises a braze stop-off material.

7. The turbine component surface treatment process of claim 1, wherein passing the UV-curable maskant through the one or more fluid flow passages is achieved at least partially via a pressurized gas.

8. The turbine component surface treatment process of claim 1, wherein treating the exterior surface comprises cleaning the exterior surface, and wherein the treatment material comprises a cleaning material.

\* \* \* \* \*